(12) United States Patent
Clancy et al.

(10) Patent No.: US 7,848,394 B2
(45) Date of Patent: Dec. 7, 2010

(54) RECONFIGURABLE TRANSCEIVER ARCHITECTURE FOR FREQUENCY OFFSET GENERATION

(75) Inventors: Raymond L. Clancy, Lake Forest, CA (US); Michael Q. Le, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 1556 days.

(21) Appl. No.: 11/013,790

(22) Filed: Dec. 17, 2004

(65) Prior Publication Data

US 2006/0056498 A1 Mar. 16, 2006

Related U.S. Application Data

(60) Provisional application No. 60/609,877, filed on Sep. 15, 2004.

(51) Int. Cl.
*H04B 1/38* (2006.01)

(52) U.S. Cl. .................. 375/219; 375/220; 375/222; 375/297; 375/327; 375/342; 331/2; 331/16; 327/101; 327/144

(58) Field of Classification Search ......... 375/135–136, 375/146–147, 219, 356, 358, 373, 375, 224–227, 375/260, 267, 355, 371, 220, 222, 295, 299, 375/327, 342, 343; 702/69, 72; 709/233–234, 709/250
See application file for complete search history.

(56) References Cited

U.S. PATENT DOCUMENTS

| | | | |
|---|---|---|---|
| 7,246,018 B1 * | 7/2007 | Lo et al. ...................... 702/72 |
| 7,254,647 B2 * | 8/2007 | Mann .......................... 709/250 |
| 7,292,662 B2 * | 11/2007 | Gregorius ................... 375/350 |
| 7,363,563 B1 * | 4/2008 | Hissen et al. ............... 714/733 |
| 2003/0189903 A1 * | 10/2003 | Hsu et al. .................... 370/241 |
| 2003/0193996 A1 * | 10/2003 | Iadanza ....................... 375/219 |
| 2004/0268190 A1 * | 12/2004 | Kossel et al. ................ 714/704 |
| 2005/0200391 A1 * | 9/2005 | Steinbach et al. ........... 327/156 |
| 2005/0286507 A1 * | 12/2005 | Sterling et al. .............. 370/363 |
| 2006/0001494 A1 * | 1/2006 | Garlepp et al. ................. 331/2 |

* cited by examiner

*Primary Examiner*—Shuwang Liu
*Assistant Examiner*—Hirdepal Singh
(74) *Attorney, Agent, or Firm*—Sterne, Kessler, Goldstein & Fox P.L.L.C.

(57) ABSTRACT

A first serial transceiver has a reference clock, a first transmitter, and a first receiver. The first receiver includes (i) a phase detector, and (ii) a phase rotator. The phase rotator is driven by the reference clock. A first multiplexer is coupled to the first receiver. The first multiplexer receives the phase detector output and a control signal. When the first serial transceiver is in a test configuration, the first multiplexer passes the control signal to the phase rotator, thereby varying the frequency of the phase rotator output. A second multiplexer is coupled to the first transmitter. The second multiplexer receives a reference clock signal and the phase rotator output. When the first serial transceiver is in a test configuration, the second multiplexer passes the phase rotator output to the first transmitter. The first transmitter thereby transmits a serial data stream that varies in frequency from said reference clock.

16 Claims, 6 Drawing Sheets

RECONFIGURABLE TRANSCEIVER ARCHITECTURE FOR FREQUENCY OFFSET GENERATION

This application claims the benefit of U.S. Provisional Application No. 60/609,877 filed Sep. 15, 2004, which is incorporated herein by reference.

BACKGROUND OF THE INVENTION

1. Field of the Invention

The present invention relates generally to data communications and more specifically to testing data communications equipment.

2. Background Art

A data communication network includes multiple communication devices and a physical layer device or medium for interconnecting or networking the communication devices. The communication devices may include stand-alone computers or embedded controllers. Often, the communication devices include or connect with high-speed analog serial data interfaces or ports configured to operate at sub-Gigabit (e.g., USB 2.0 at 480 Mbps) or Gigabit-per-second (Gbps) data rates. Typically, the serial data interfaces are configured in accordance with known data transmission standards, such as optical fiber and copper wire Ethernet standards. A physical layer device interfaces with such high-speed analog serial data links. It is desirable that the physical layer device be capable of operating at the Gigabit-per-second data rates, and in accordance with the different transmission standards.

To accommodate such data rates and standards, a physical layer device may contain, among other devices, a serializer/deserializer (SERDES) device. A SERDES device may include a high speed serial transceiver. Such transceivers contain embedded clocks and circuits designed for clock and data recovery (CDR). These CDR circuits present a challenge for high volume production testing using automated test equipment (ATE). In order to identify devices with faults in their CDR circuits, it is desirable that the ATE generate a sufficiently high speed serial data stream that varies in frequency or is otherwise offset from the embedded reference clock. Because the typical ATE cannot provide such a frequency varying data stream, alternative test techniques must be used to mimic these signals. Such techniques are costly, and involve compromises which result in less than complete fault coverage.

Typical solutions to this problem involve either adding circuitry to the device (e.g., adding an additional phase locked loop (PLL) and clock circuitry), or making use of certain test techniques such as using a high speed analog clock to mimic a 1010 . . . 1 data stream. Also, because these high speed transceivers often make use of the latest process technologies, it can be very difficult for ATE vendors to supply test equipment that is effective at ever higher frequencies and changing standards. Therefore, there is a need for a simpler and more cost effective method of generating a high speed serial data stream that varies in frequency or is otherwise offset from the embedded reference clock.

BRIEF SUMMARY OF THE INVENTION

The invention comprises modifications made to the architecture of a high speed serial transceiver. An existing phase rotator, typically located in a receiver portion of the serial transceiver, is converted into a frequency synthesizer used to clock and generate data with the paired transmitter portion of the serial transceiver. In a test environment, the transmitter output can then be looped back externally to other similar serial ports, thereby enabling testing of CDR circuits without the need for specialized ATE equipment to generate the high speed serial data stream at varying or offset frequencies.

In an embodiment, the invention comprises a first serial transceiver having a reference clock, a first transmitter, and a first receiver. The first receiver includes a phase detector, and a phase rotator. The phase rotator is driven by the reference clock. A first multiplexer is coupled to the first receiver. The first multiplexer receives (i) the phase detector output and (ii) a control signal. When the first serial transceiver is in a test configuration, the first multiplexer passes the control signal to the phase rotator, thereby varying the frequency of the phase rotator output. A second multiplexer is coupled to the first transmitter. The second multiplexer receives (i) a reference clock signal and (ii) the phase rotator output. When the first serial transceiver is in the test configuration, the second multiplexer passes the phase rotator output to the first transmitter. The first transmitter thereby transmits a serial data stream that varies in frequency from said reference clock.

In another embodiment, a multi-port physical layer device has a first and a second transceiver. A phase rotator in a receiver portion of the first transceiver is used to vary the frequency of a reference clock signal. The varying frequency reference clock signal is passed to a transmitter portion of the first transceiver. The transmitter portion then transmits a serial data stream that varies in frequency from the reference clock. A second transceiver receives the varying frequency serial data stream, thereby testing the ability of the second transceiver to respond to a varying frequency input.

BRIEF DESCRIPTION OF THE DRAWINGS/FIGURES

The accompanying drawings/Figures, which are incorporated herein and form part of the specification, illustrate the present invention and, together with the description, further serve to explain the principles of the invention and to enable a person skilled in the pertinent art to make and use the invention. In the drawings, like reference numbers indicate identical or functionally similar elements. In the drawings, the indicators "D," "S," "d," and "c" respectively indicate or represent "Deserializer," "Serializer," "data signal," and "clock signal."

DETAILED DESCRIPTION OF THE INVENTION

The present invention minimizes the additional silicon area required to create a high speed serial data stream at a frequency that varies or is offset from an embedded reference clock. This is accomplished by leveraging existing functional transceiver circuitry such as a phase rotator, a reference clock and a transmitter. Devices with multiple transceivers that are tested with an embodiment of this invention can take advantage of efficiency gains created by testing multiple ports in parallel. This allows CDR circuits from a high-count multi-lane transceiver to be tested in the same time as a dual-lane transceiver, thereby enabling an inexpensive way to test high speed serial devices in a production environment.

Figure 1:
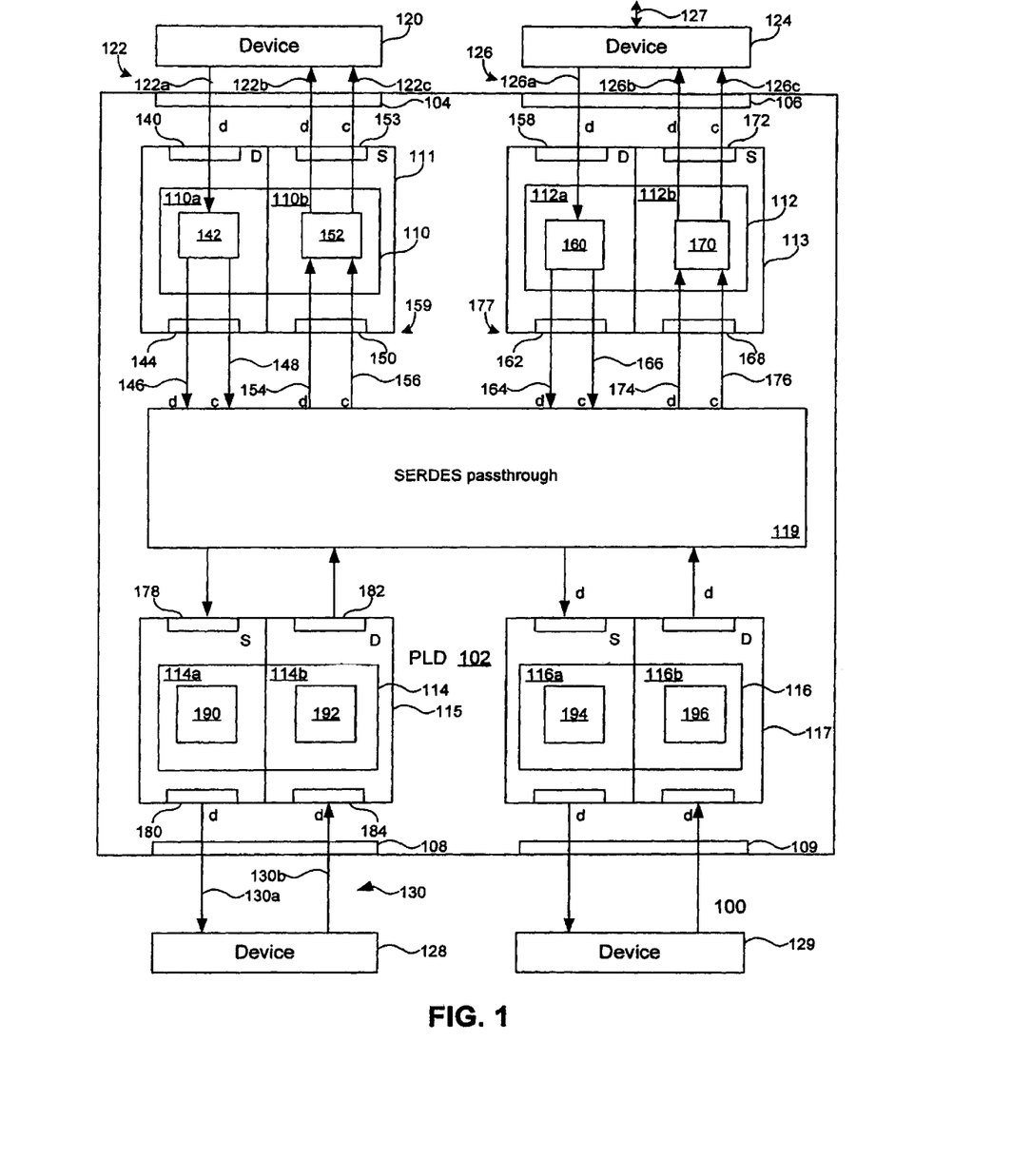
FIG. 1 is a block diagram of an example system in which an embodiment of the invention may operate.

FIG. 1 is a block diagram of an example system 100 in which embodiments of the present invention may operate. System 100 includes a physical layer device (PLD) 102. In an embodiment, PLD 102 is constructed on a single integrated circuit (IC) substrate or chip. PLD 102 may be implemented in Complementary Metal Oxide Semiconductor (CMOS) technology, for example. Other semiconductor technologies may be used.

PLD 102 includes multiple input/output (I/O) ports 104, 106, 108, and 109. I/O ports 104-109 represent connectors, conductive traces, PLD I/O pins, receivers and drivers, and the like, associated with coupling signals to and from PLD 102. PLD 102 may include multiple serializer-deserializer (SERDES) devices or other devices which typically implement serial transceivers. For example, PLD 102 contains a SERDES device 111 coupled to I/O port 104, a SERDES device 113 coupled to I/O port 106, a SERDES device 115 coupled to I/O port 108, and a SERDES device 117 coupled to I/O port 109. Each SERDES device includes a serial transceiver that comprises (i) a transmitter/serializer (S) for serializing a parallel data signal, to produce a serial data signal, and (ii) a receiver/deserializer (D) for deserializing a serial data signal, to produce a parallel data signal, as is described in detail below. PLD 102 may also include a SERDES passthrough module 119 coupled between SERDES devices 111, 113, 115, and 117. Such a SERDES pass through module is described in U.S. patent application Ser. No. 10/392,831, entitled "A Physical Layer Device Having an Analog SER-DES Pass Through Mode," filed Mar. 21, 2003, which is herein incorporated by reference.

PLD 102 may interface with a variety of communication or network devices. For example, device 120 interfaces through I/O port 104, a high-speed analog serial data interface 122 (where the I/O port and the data interface are collectively referred to as a serial interface of PLD 102) and SERDES device 111. Network device 120 may be a Media Access Controller (MAC). Serial data interface 122 includes bi-directional serial data signals 122a and 122b, and a clock signal 122c synchronized with serial data signal 122b. Bi-directional serial data signals 122a and 122b have example baud rates of 1.25 Gbps, and clock signal 122c has a corresponding example clock rate or frequency of 1.25 GHz.

PLD 102 may also interface with, for example, an optical fiber module 124 through I/O port 106, a high-speed analog serial data interface 126 (where the I/O port and the data interface are collectively referred to as a serial interface of PLD 102) and SERDES device 113. High-speed serial data interface 126 includes bi-directional analog serial data signals 126a and 126b having example baud rates in the gigabit-per-second range. Serial interface 126 also includes a clock signal 126c synchronized with and having a frequency commensurate with serial data signal 126b. Optical fiber module 124 interfaces with an optical line 127. Optical fiber module 124 may operate in accordance with IEEE 802.3 for 1000 Base-X, for example.

Similarly, PLD 102 may interface with a communication or network device 128 through I/O port 108, a high-speed analog serial data interface 130 (where the I/O port and the data interface are collectively referred to as a serial interface of PLD 102), and SERDES device 115. Serial data interface 130 includes bi-directional serial data signals 130a and 130b having baud rates in the Gbps range. Serial data signals 130a and 130b may be carried over a copper line associated with an Ethernet link, for example, coupled to I/O port 108. SERDES device 115 may be an Ethernet transceiver that operates in accordance with IEEE 802.3 for 10/100/1000 Base-T, for example.

It is understood that communication or network devices 120, 124, 128, and 129 and SERDES devices 111, 113, 115, and 117 are exemplary and may be replaced by a multitude of other interface devices in other arrangements of the present invention. For example, SERDES device 113 and optical system 124 and 127 may be replaced with a transceiver and an associated interface suitable for copper-based signals, while SERDES device 115 and associated interface 130 may be replaced by a transceiver and interface suitable for optical signals, and so on. In an embodiment, a Quad Gigabit NIC is used with an octal 1.25 Gbps SERDES.

As described in more detail below, each SERDES device includes a serial transceiver. The transceivers have a receiver for deserializing data and a transmitter for serializing data. The terms "deserializes" and "deserializing" mean to convert serial data to parallel data. The terms "serializes" and "serializing" mean to convert parallel data to serial data.

For example, in a deserializer portion, SERDES device 111 includes a deserializer input 140, a receiver 110a, a clock and data recovery (CDR) module 142, and deserializer output 144. In operation, communication device 120 transmits serial data signal 122a to deserializer input 140. Receiver 110a and CDR module 142 deserialize the serial data signal 122a received at deserializer input 140, to produce a deserialized data signal 146. CDR module 142 recovers a clock signal 148 from received serial data signal 122a. Recovered clock signal 148 represents received signal timing, for example, the timing of data symbols included in received serial data signal 122a. Receiver 110a transmits signals 146 and 148 from deserializer output 144. Clock signal 148 is synchronous with data signal 146.

CDR module 142 generates deserialized data signal 146 as a series of N1-bit wide parallel digital data words, having a data rate equal to R1/N1, where R1 is the data rate of received serial data signal 122a. Thus, the aggregate data rate of deserialized data signal 146 is equal to the data rate of serial data signal 122a. CDR module 142 generates clock signal 148 synchronously with deserialized data signal 146, and at a frequency equal to R1/N1. In an example arrangement, N1=10 and R1=1.25 GHz. Thus, serial data signal 122a has a data rate of 1.25 GHz, module 142 generates 10-bit parallel words at a data rate of 125 MHz (1.25 GHz=10 times 125 MHz), and clock signal 148 has a frequency of 125 MHz.

In a serializing portion, SERDES device 111 also includes a serializer input 150, a transmitter 110b, a serializer module 152, and a serializer output 153. In an optional configuration described U.S. patent application Ser. No. 10/392,831, filed Mar. 21, 2003, SERDES passthrough module 119 provides a deserialized data signal 154 and an associated clock signal 156 to deserializer input 150. Transmitter 110b and serializer 152 serialize the deserialized data signal 154 in accordance with clock signal 156, to produce serialized data signal 122b. Serializer 152 also produces clock signal 122c synchronous with serial data signal 122b. Transmitter 110b transmits signals 122b and 122c from serializer output 153.

In an example arrangement, deserialized data signal 154 includes a series of N2-bit wide parallel digital data words, having a data rate equal to R2/N2, where R2 is the data rate of received serial data signal 126a. Thus, the aggregate data rate of deserialized data signal 154 is equal to the data rate of serial data signal 126a. Also, clock signal 156 is synchronous with deserialized data signal 154, and has a frequency equal to R2/N2. In an example arrangement, N2=10 and R2=1.25 GHz. Thus, serial data signal 126a has a data rate of 1.25 GHz, data signal 154 includes 10-bit parallel words at a data rate of 125 MHz (1.25 GHz=10 times 125 MHz), and clock signal 156 has a frequency of 125 MHz. Based on these data and clock rates, serializer 152 generates serial data signal 122b at a data rate of 1.25 GHz, and clock signal 122c at a frequency of 1.25 GHz.

The terms "deserialized" and "parallel" are used equivalently and interchangeably herein. Also, a deserializer output is a parallel data output and a serializer input is a parallel data input. Together, a deserializer output (e.g., deserializer output 144) and a serializer input (e.g., serializer input 150) represent a parallel port of a SERDES device (e.g., a parallel port of SERDES device 111). Similarly, a deserializer input (e.g., deserializer input 140) and a serializer output (e.g., serializer output 153) collectively represent a serial port of a SERDES device (e.g., a serial port of SERDES device 111).

SERDES device 113 includes a transceiver 112. Transceiver 112 has a receiver 112a for deserializing data and a transmitter 112b for serializing data. In a deserializing portion, SERDES device 113 includes a deserializer input 158, a receiver 112a, a CDR module 160, and a deserializer output 162. Receiver 112a operates in substantially the same way as receiver 110a. Serializer input port 158 receives serial data signal 126a. Receiver 112a and CDR module 160 deserialize the received serial data signal 126a, to produce deserialized or parallel data signal 164. CDR module 160 also recovers a clock signal 166 from received serial data signal 126a. From deserializer output 162, receiver 112a optionally transmits signals 164 and 166 to SERDES passthrough 119.

In the serializing portion, transmitter 112b operates in substantially the same way as transmitter 110b. SERDES passthrough 119 optionally provides a deserialized or parallel data signal 174 and its associated clock signal 176 to serializer input 168. Transmitter 112b and serializer module 170 serialize the deserialized data 174 in accordance with clock signal 176, to produce serial data signal 126b and its associated clock signal 126c. Data signal 126b and clock signal 126c have example data and clock rates in the GHz range. Together, deserializer output 162 and serializer input 168 represent a parallel port 177 of SERDES device 113. SERDES device 113 supports example data rates and uses parallel data bit-widths similar to or the same as those of SERDES device 111, mentioned above. In an alternative arrangement, module 170 generates only a serial data signal that essentially encapsulates both data and clock signals 126b and 126a.

SERDES 115 includes a transceiver 114. Transceiver 114 has a receiver 114b for deserializing data and a transmitter 114a for serializing data. SERDES device 115 includes a serializer input 178 and a serializer output 180, as well as a deserializer input 184 and a deserializer output 182. SERDES passthrough 119 optionally provides a deserialized data signal 186 to serializer input 178. Transmitter 114a and serializer 190 serialize the deserialized data signal 186 into serialized data signal 130a, and transmit the serialized data signal from serializer output 180. SERDES device 115 receives serial data signal 130b at deserializer input 184. Receiver 114b and CDR module 192 deserialize the serial data signal 130b, to produce deserialized data signal 188. Receiver 114b optionally transmits deserialized data signal 188 to SERDES passthrough 119, from deserializer output 182. Together, deserializer output 182 and serializer input 178 represent a parallel port 189 of SERDES device 115. SERDES device 115 may support example data rates similar to or the same as those of SERDES devices 111 and 113, mentioned above. SERDES device 115 may support parallel data bit-widths different from those used with SERDES devices 111 and 113. In another embodiment, SERDES device 115 generates clock signals associated with data signals in a manner similar to SERDES devices 111 and 113.

SERDES device 117 includes transceiver 116, which comprises a transmitter 116a and a receiver 116b. Receiver 116b includes a CDR module 196 and operates in substantially the same way as receiver 110a. Transmitter 116a includes a serializer module 194 and operates in substantially the same way as transmitter 110b.

Figure 2:
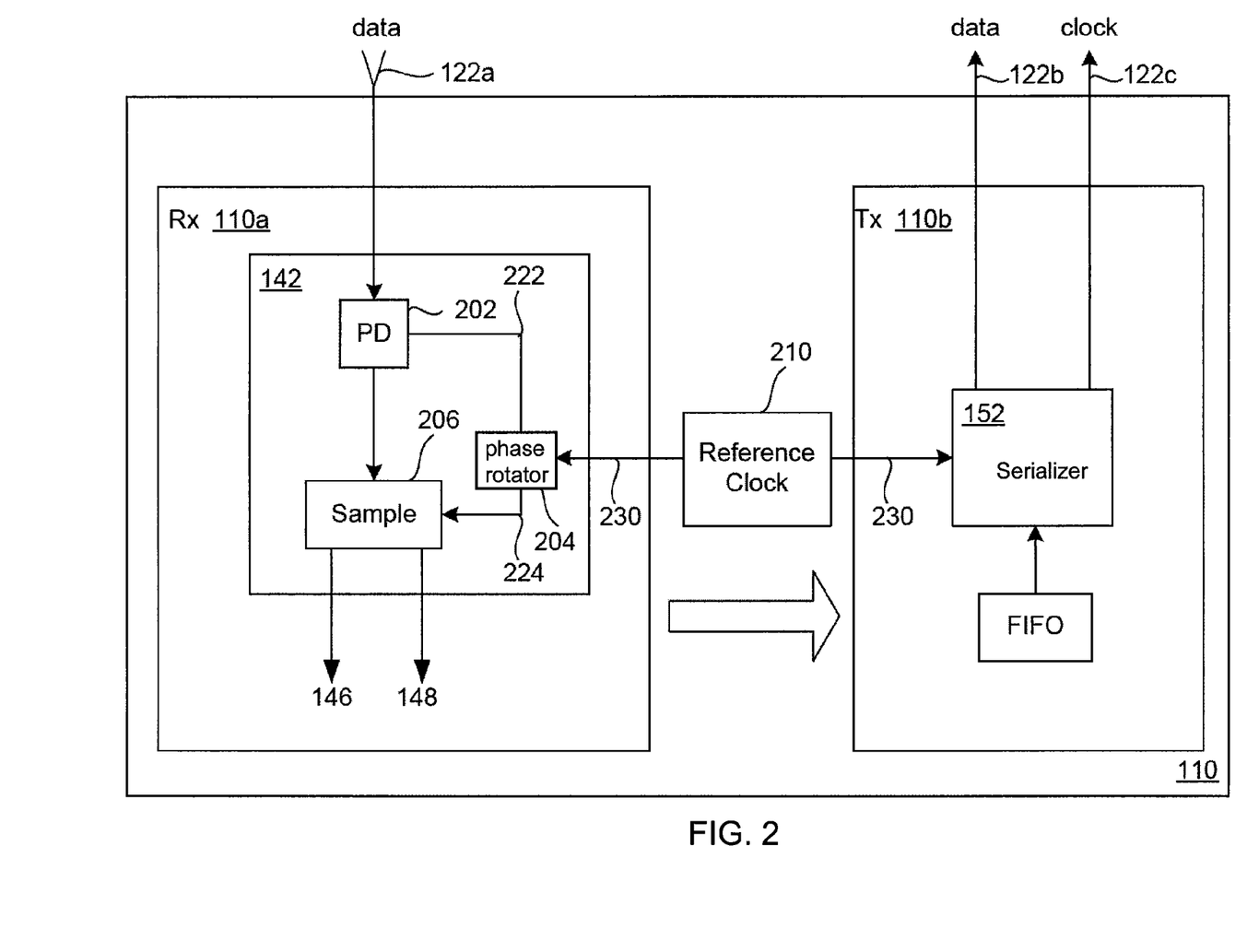
FIG. 2 is a block diagram of a serial transceiver.

FIG. 2 is a block diagram of serial transceiver 110 in which embodiments of the present invention may operate. FIG. 2 illustrates in greater detail the operation of CDR module 142. CDR module 142 recovers a data signal 146 and a clock signal 148 from received data signal 122a. The recovered clock signal 148 represents received signal timing, for example, the timing of data signals included in received serial data single 122a. Additionally, CDR module 142 corrects any frequency offset that may be present between the received data stream 122a and a reference clock 210. Reference clock 210 may be, for example, phase locked loop (PLL). CDR module 142 corrects any frequency offset by first sampling the received signal 122a at phase detector 202. Phase detector 202 senses errors caused by any frequency offset in received data signal 122a. Phase detector output 222 is essentially an error signal, which is sent to phase rotator 204. Phase rotator 204 speeds up or slows down a phase rotation of reference clock 210 thereby changing its frequency. Phase rotator output 224, which is driven by reference clock signal 230, then adjusts the frequency of sampler 206 accordingly. In this fashion, the sampling of the received data is automatically synchronized with reference clock 210.

To properly test the CDR circuit, therefore, it is desirable for any automatic testing equipment (ATE) to generate a high speed serial data stream that varies or is offset in frequency from reference clock 210 so as to check the ability of the phase detector 202 and the phase rotator 204 to correct the offset. As noted above, generating such data can be costly and can result in less than complete fault coverage.

Figure 3:
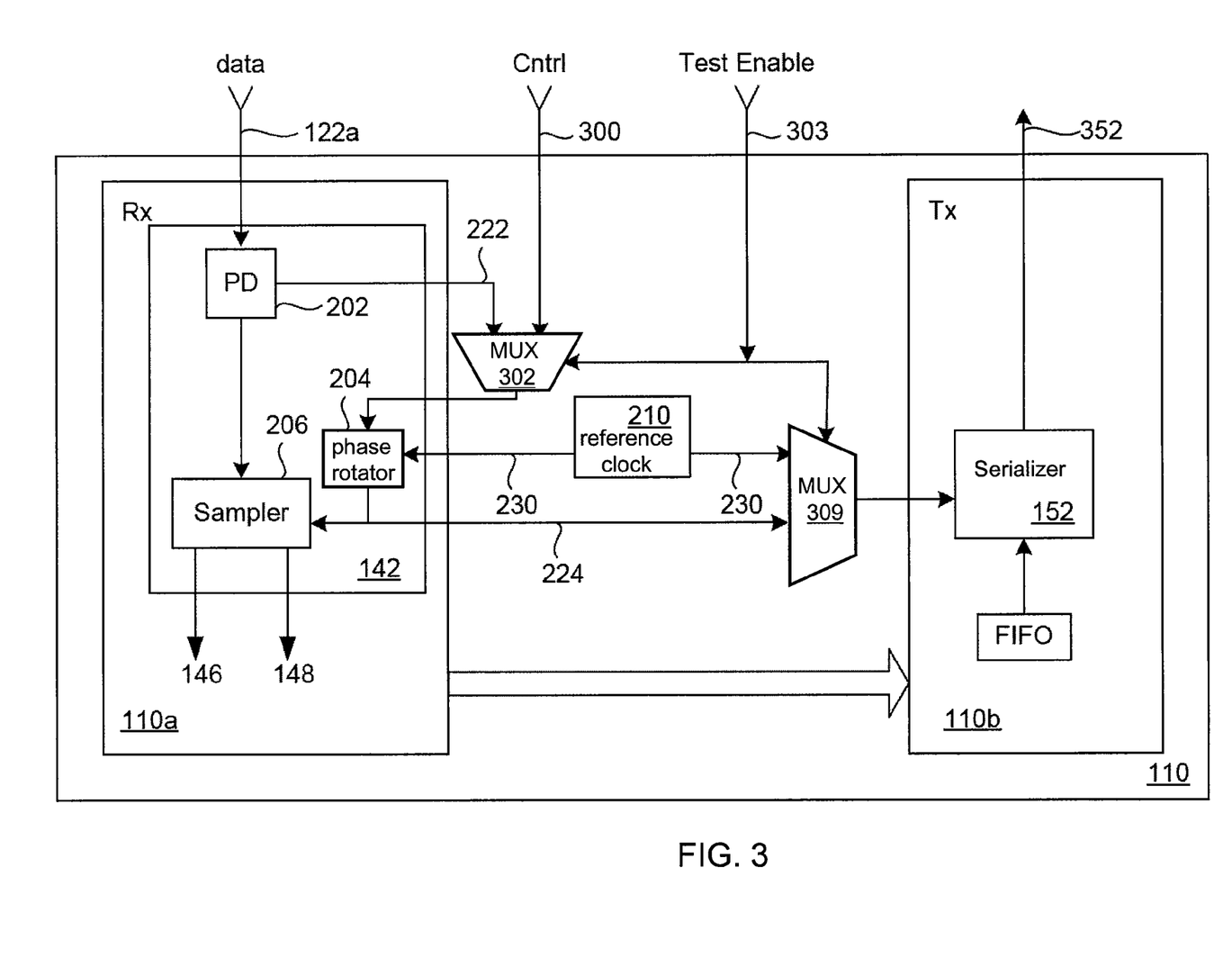
FIG. 3 is a block diagram of an exemplary serial transceiver modified to generate a serial data stream that varies in frequency from the reference clock.

FIG. 3 is a block diagram illustrating how the architecture of a serial transceiver 110 may be modified, according to an embodiment of the invention; to generate a high speed serial data stream whose frequency varies or is otherwise offset from the reference clock 210. A first multiplexer 302 is coupled to receiver 110a. Specifically, multiplexer 302 is disposed between phase detector 202 and phase rotator 204. Multiplexer 302 receives (i) the phase detector output 222 and (ii) a control signal 300. Multiplexer 302 has a test enable input 303 that is enabled to put serial transceiver 110 into a test configuration. When in the test configuration, multiplexer 302 decouples phase rotator 204 from phase detector 202, and substitutes control signal 300 for the phase detector output 222. In other words, multiplexer 302 passes control signal 300 to phase rotator 204 when the transceiver 110 is in a test configuration. Phase rotator 204 rotates the phase of reference clock signal 230 based on the control signal 300 to produce a phase rotator output 224 that varies in frequency.

Phase rotator output 224 is then transmitted to a second multiplexer 309. Multiplexer 309 is coupled to transmitter 110b. Specifically, multiplexer 309 is disposed between reference clock 210 and serializer 152. Multiplexer 309 receives (i) a reference clock signal 230, and (ii) phase rotator output 224. Like the first multiplexer 302, the second multiplexer 309 also has a test enable input 303 that is enabled when serial transceiver 110 is put into a test configuration. When in the test configuration, multiplexer 309 substitutes phase rotator output 224 for the reference clock signal 230. In other words, multiplexer 309 passes the phase rotator output 224 to transmitter 110b when the serial transceiver 110 is in the test configuration. As a result, serial transmitter 110b transmits a serial data stream 352 that varies in frequency from reference clock 210. This occurs because phase rotator 204 varies the phase of the reference clock 210 according to the control signal 300.

According to the embodiment described above, the architecture of the transceiver in SERDES device 111 can be modified to generate a high speed serial data stream 352 that varies or is offset in frequency from reference clock 210. The extent to which the frequency of serial data stream 352 varies or is offset from reference clock 210 is determined by control signal 300. Control signal 300 can be from an external source, or it may be supplied by an internal state machine or a programmable logic device. Control signal 300 simulates a perceived frequency error in received data stream 122a thereby varying the frequency of phase rotator output 224 as it attempts to track the perceived error in the incoming data stream 122a. For example, control signal 300 could be a static word that results in a particular static frequency offset. Alternatively, control signal 300 could be a dynamically changing word that results in a dynamically changing frequency offset. A dynamically changing frequency could be used to reproduce specific frequency modulation schemes such as spread spectrum clocking (frequency downspreading) used in serial-ATE transceivers (SATE).

This resulting data stream, can then be used as a test input into similar ports that have not been put into the test configuration. For example, it could be a test input for an input port 158 of SERDES device 113 to test CDR module 160. The modification leverages existing functional SERDES transceiver circuitry and thus has the additional advantage of inherently being in the correct frequency range and data format for automatic testing. Such modifications obviate the need for an externally generated test source and its attendant disadvantages.

Figure 4A:
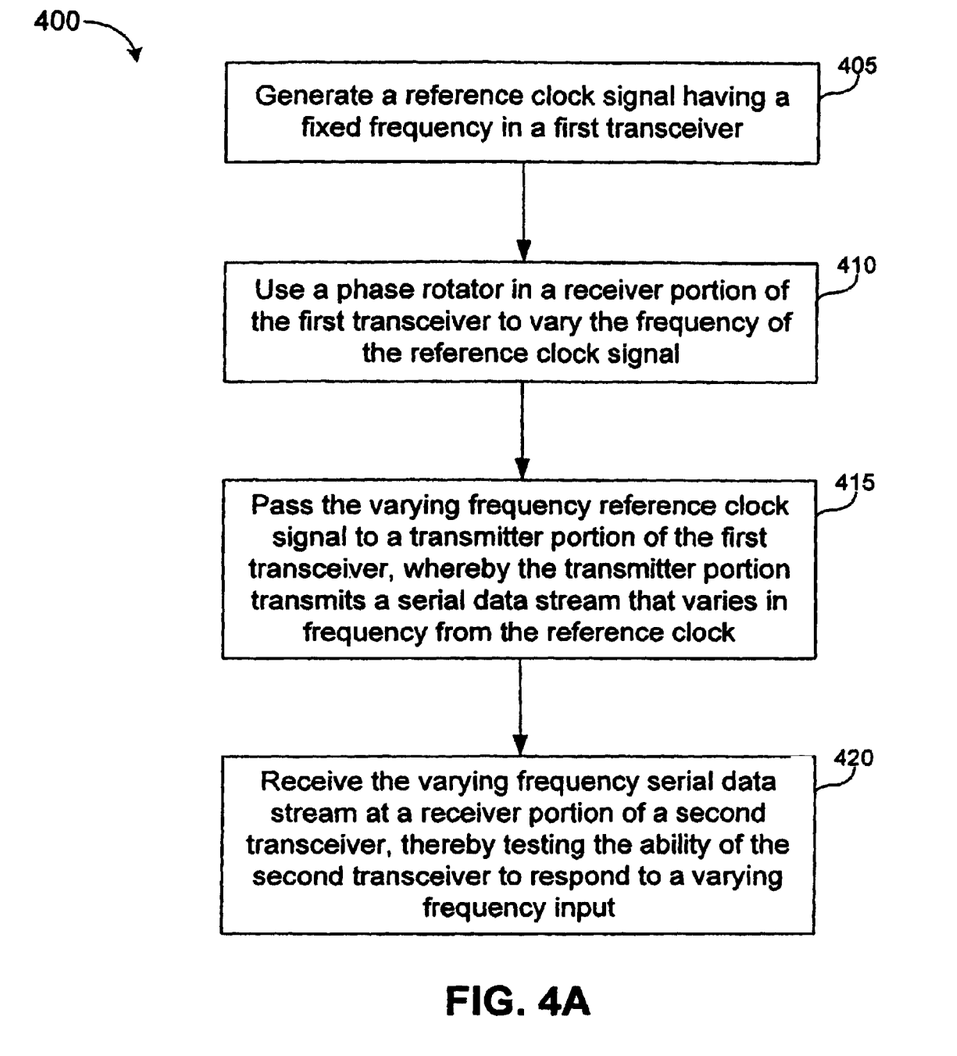
FIGS. 4A and 4B illustrate a method of testing a multi-port physical layer device according to an embodiment of the invention.
Figure 4B:
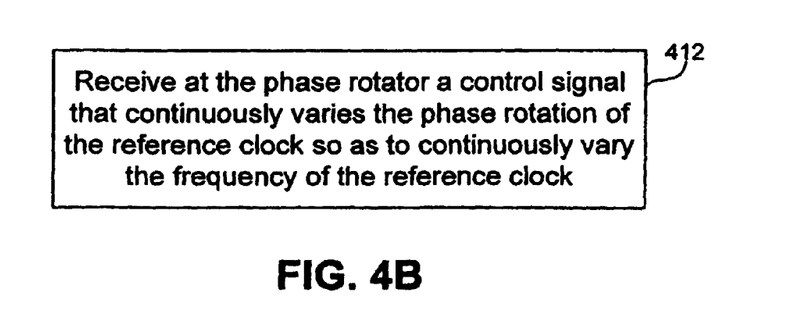

FIGS. 4A and 4B illustrate a method 400 of testing a multi-port physical layer device (e.g., PLD 102) having a first transceiver and a second transceiver (e.g., transceivers 110 and 112). In step 405 of FIG. 4A, reference clock 210 generates a signal having a fixed frequency 230. As noted above, a common method of implementing such a reference clock is with a phase locked loop. Step 410 illustrates using phase rotator 204, which is in a receiver portion 110a of the first transceiver 110, to vary the frequency of reference clock signal 230. As shown above, phase rotator 204 is typically part of CDR circuit 142 and is used in combination with phase detector 202 to account for frequency offsets in received data signal 122a. In step 415, the varying frequency reference clock signal 224 is passed to the transmitter portion 110b of the first transceiver 110. When the transmitter portion 110b uses the varying frequency reference clock signal 224 in lieu of reference clock 230, it transmits a serial data stream that varies in frequency from the reference clock. In step 420, the receiver portion 112a of the second transceiver 112 receives the varying frequency serial data stream. This permits second transceiver 112 to test its ability to respond to a varying frequency input. More specifically, step 420 includes determining the ability of CDR circuit 142 in the second transceiver to track the varying frequency serial data stream.

FIG. 4B further illustrates the manner by which the phase rotator varies the frequency of the reference clock output. In step 412, which may be performed concurrently with step 410, the phase rotator 204 receives a control signal 300 that, for example, continuously varies the phase rotation of reference clock signal 230 so as to continuously vary the frequency of the reference clock. As described above, control signal 300 simulates a perceived frequency error in received data stream 122a thereby rotating the phase of the incoming reference clock signal 230. This phase rotation causes the frequency of phase rotator output 224 to vary. For example, control signal 300 could be a static word that results in a particular static frequency offset. Alternatively, control signal 300 could be a dynamically changing word that results in a dynamically changing frequency offset. Control signal 300 can come from an external input, or could originate from the PLD itself in a state machine or a programmable logic device.

Figure 5A:
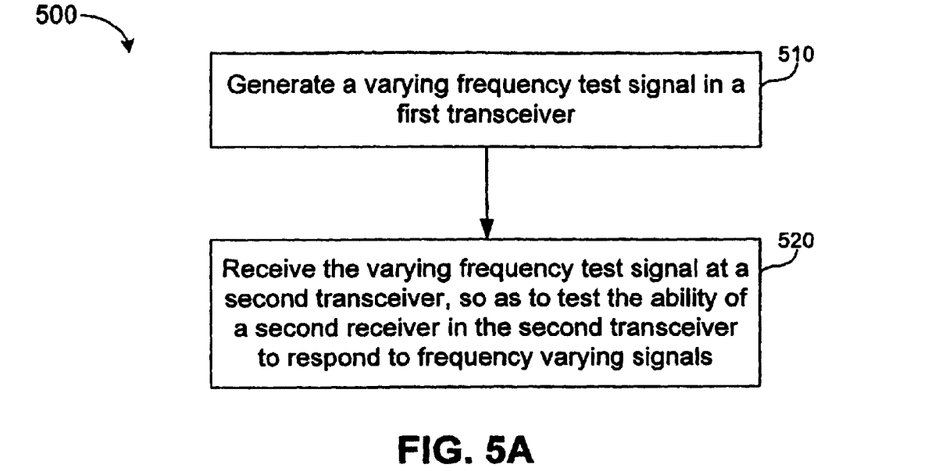
FIGS. 5A, 5B and 5C illustrate a method of testing a multi-port physical layer device according to another embodiment of the invention.
Figure 5B:
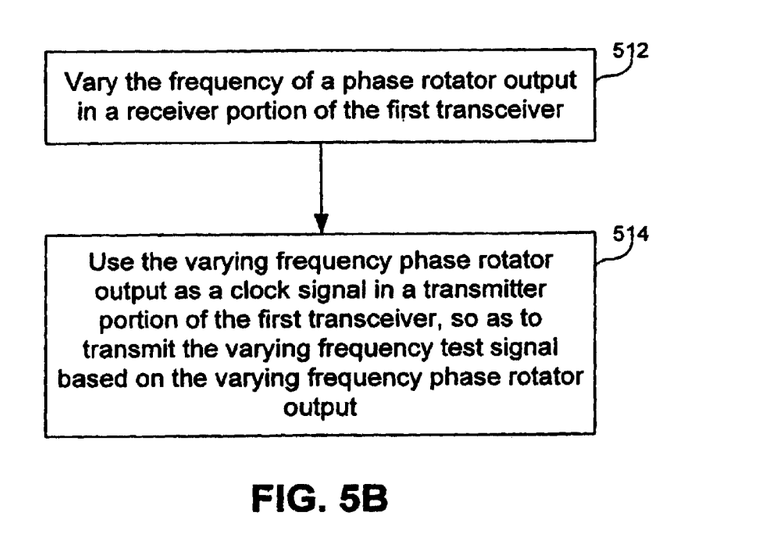
Figure 5C:
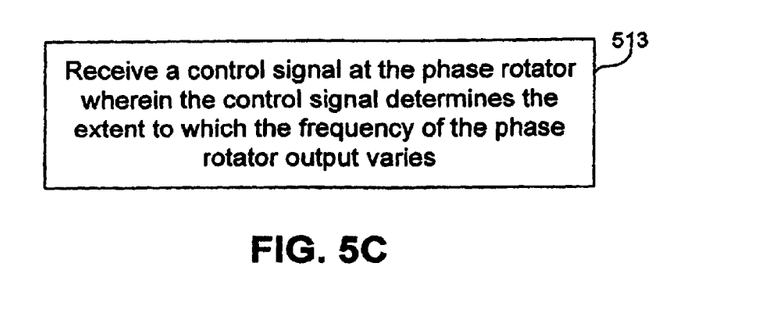

FIGS. 5A, 5B and 5C illustrate an alternative method 500 of testing a multi-port physical layer device (e.g., PLD 102) having a plurality of transceivers (e.g., transceivers 110, 112, 114 and 116). According to step 510 of FIG. 5A, a first transceiver generates a varying frequency test signal. In step 520, the varying frequency test signal is received at a second transceiver, so as to test the ability of a second receiver in the second transceiver to respond to frequency varying signals. More specifically, step 520 includes determining the ability of CDR circuit 142 in the second transceiver to track the varying frequency serial data stream.

A method of generating the varying frequency test signal in the first transceiver is described more specifically in FIG. 5B. According to step 512, an output frequency of a phase rotator output in a receiver portion of the first transceiver is varied. In step 514, the varying frequency phase rotator output is used as a clock signal in a transmitter portion of the first transceiver, so as to transmit the varying frequency test signal based on the varying frequency phase rotator output.

FIG. 5C further illustrates the method by which a frequency of the phase rotator output is varied. More specifically, according to step 513, the phase rotator receives a control signal wherein the control signal determines the extent to which the frequency of the phase rotator output varies. As described above, control signal 300 simulates a perceived frequency error in received data stream 122a thereby rotating the phase of the incoming reference clock signal 230. This phase rotation causes the frequency of phase rotator output 224 to vary. For example, control signal 300 could be a static word that results in a particular static frequency offset. Alternatively, control signal 300 could be a dynamically changing word that results in a dynamically changing frequency offset. Control signal 300 can come from an external input, or could originate from the PLD itself in a state machine or a programmable logic device.

Figure 6:
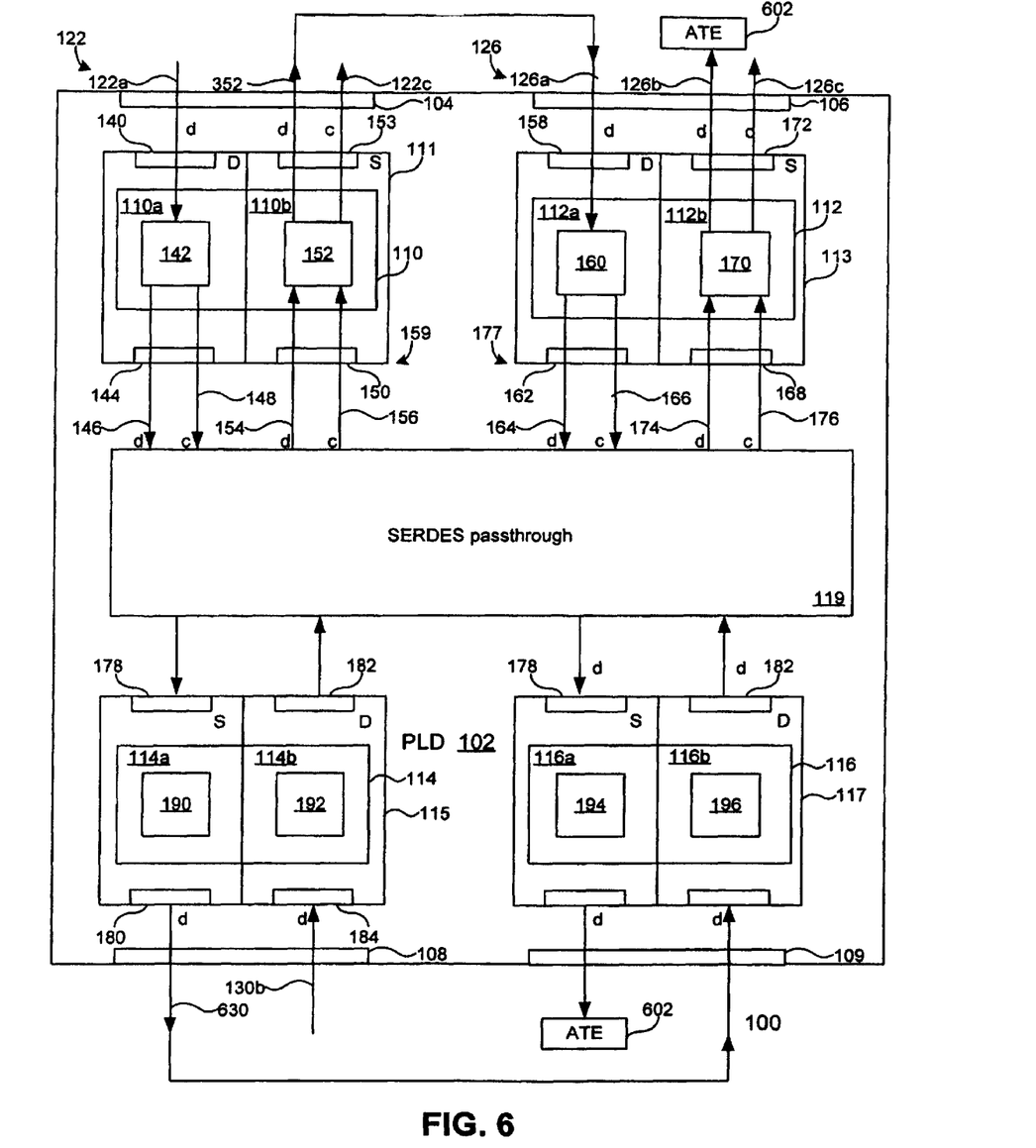
FIG. 6 is a block diagram of an example system in a test configuration.

FIG. 6 is a block diagram of PLD 102 in an exemplary test configuration. To make use of the varying frequency serial data stream 352 in a test environment, the signal 352 can be supplied to, for example, input 158 of SERDES device 113. ATE 602 can now evaluate the performance of the CDR circuit 160 using a data stream supplied internally by SERDES device 111. In a similar fashion, the serial transceiver 114 in SERDES device 115 can be put in to a test configuration to supply a varying frequency serial data stream 630 to SERDES device 117 in order to test the performance of CDR circuit 196. In an embodiment, any additional ports could be similarly configured thereby allowing half the ports to be temporarily sacrificed to test the other half of the ports. PLD 102 could be completely tested by subsequently putting the ports in the opposite configuration. For example, the serial transceivers in SERDES 113 and 117 would be put in to the test configuration to generate the varying frequency serial data stream, while the ATE would be coupled to SERDES 111 and 115.

What is claimed is:

1. A device for generating a test signal in a serial transceiver, comprising:
   a first serial transceiver having a reference clock, a first receiver, and a first transmitter, said first receiver including (i) a phase detector, and (ii) a phase rotator driven by said reference clock;
   a first multiplexer coupled to said first receiver, wherein said first multiplexer is configured to receive (i) a phase detector output and (ii) a control signal, and wherein said first multiplexer is configured to pass said control signal to said phase rotator when said first serial transceiver is in a test configuration, thereby varying a frequency of said phase rotator output; and
   a second multiplexer coupled to said first transmitter, wherein said second multiplexer is configured to receive (i) said reference clock and (ii) said phase rotator output, and wherein said second multiplexer is configured to pass said phase rotator output to said first transmitter when said first serial transceiver is in said test configuration, thereby causing said first transmitter to transmit a serial data stream that varies in frequency from said reference clock.

2. The device of claim 1, wherein said first transceiver is configured to be placed in said test configuration by receiving a test enable signal at said first multiplexer and said second multiplexer.

3. The device of claim 1, wherein said varying frequency serial data stream is received by a second serial transceiver, thereby testing a frequency response of said second serial transceiver.

4. The device of claim 1, wherein said control signal is supplied from an external source.

5. The device of claim 1, wherein said control signal is internally generated by a programmable logic device.

6. The device of claim 1, wherein said control signal is internally generated by a state machine.

7. The device of claim 1, wherein said serial data stream is offset in frequency from said reference clock.

8. The device of claim 1, wherein said serial data stream continuously varies in frequency.

9. A method for generating a test signal in a first serial transceiver, said first serial transceiver having a reference clock, a first receiver, and a first transmitter, said first receiver including a phase detector, and a phase rotator driven by said reference clock, comprising:
   (a) receiving, by a first multiplexer coupled to said first receiver, a phase detector output and a control signal;
   (b) passing, by said first multiplexer, said control signal to said phase rotator when said first serial transceiver is in a test configuration, thereby varying a frequency of said phase rotator output;
   (c) receiving, by a second multiplexer coupled to said first transmitter, said reference clock and said phase rotator output; and
   (d) passing, by said second multiplexer, said phase rotator output to said first transmitter when said first serial transceiver is in said test configuration, thereby causing said first transmitter to transmit a serial data stream that varies in frequency from said reference clock.

10. The method of claim 9, further comprising:
    (e) placing said first transceiver in said test configuration by receiving a test enable signal at said first multiplexer and said second multiplexer.

11. The method of claim 9, further comprising:
    (e) receiving said varying frequency serial data stream by a second serial transceiver, thereby testing a frequency response of said second serial transceiver.

12. The method of claim 9, further comprising:
    (e) supplying said control signal from an external source.

13. The method of claim 9, further comprising:
    (e) internally generating said control signal by a programmable logic device.

14. The method of claim 9, further comprising:
    (e) internally generating said control signal by a state machine.

15. The method of claim 9, wherein said serial data stream is offset in frequency from said reference clock.

16. The method of claim 9, wherein said serial data stream continuously varies in frequency.

* * * * *